United States Patent
Kim et al.

(10) Patent No.: US 7,480,182 B2
(45) Date of Patent: Jan. 20, 2009

(54) NOR FLASH MEMORY DEVICES IN WHICH A PROGRAM VERIFY OPERATION IS PERFORMED ON SELECTED MEMORY CELLS AND PROGRAM VERIFY METHODS ASSOCIATED THEREWITH

(75) Inventors: Bo-Geun Kim, Gyeonggi-do (KR); Heung-Soo Lim, Gyeonggi-do (KR); Jae-Woo Lim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 30 days.

(21) Appl. No.: 11/486,227

(22) Filed: Jul. 13, 2006

(65) Prior Publication Data

US 2007/0047320 A1    Mar. 1, 2007

(30) Foreign Application Priority Data

Aug. 10, 2005    (KR) .................... 10-2005-0073444

(51) Int. Cl.
*G11C 6/06* (2006.01)

(52) U.S. Cl. ................... 365/185.22; 365/185.02; 365/185.03; 365/185.18

(58) Field of Classification Search ............ 365/185.02, 365/185.03, 185.18, 185.22
See application file for complete search history.

(56) References Cited

U.S. PATENT DOCUMENTS

| 5,321,699 | A | 6/1994 | Endoh et al. ............... 371/21.5 |
| 6,026,049 | A | 2/2000 | Park |
| 6,091,637 | A | 7/2000 | Hakozaki |
| 6,314,027 | B1 | 11/2001 | Choi |
| 6,807,104 | B2 * | 10/2004 | Arai et al. ............... 365/185.24 |
| 7,272,050 | B2 * | 9/2007 | Han et al. ............... 365/185.22 |
| 2004/0095807 | A1 | 5/2004 | Suh et al. ............... 365/185.22 |

FOREIGN PATENT DOCUMENTS

| JP | 05-182474 | 7/1993 |
| JP | 11-96774 A | 4/1999 |
| JP | 2004-171747 | 6/2004 |
| JP | 2005-038567 A | 2/2005 |
| KR | 1997-49571 | 7/1997 |
| KR | 1020000061083 A | 10/2000 |
| KR | 2001-0011482 A | 2/2001 |
| KR | 2002-0055893 A | 7/2002 |
| KR | 1020040043363 A | 5/2004 |

OTHER PUBLICATIONS

Korean Intellectual Property Office Notice to Submit Response for Application No. 10-2005-0073444; date of mailing Aug. 23, 2006.
English translation of Korean Intellectual Property Office Notice to Submit Response for Application No. 10-2005-0073444; date of mailing Aug. 23, 2006.

* cited by examiner

*Primary Examiner*—VanThu Nguyen
(74) *Attorney, Agent, or Firm*—Myers Bigel Sibley & Sajovec, P.A.

(57) ABSTRACT

A program operation for a NOR flash memory device is verified by programming data in a memory cell, performing a dummy verify operation on the memory cell, and performing a program verify operation on the memory cell based on a result of the dummy verify operation.

20 Claims, 6 Drawing Sheets

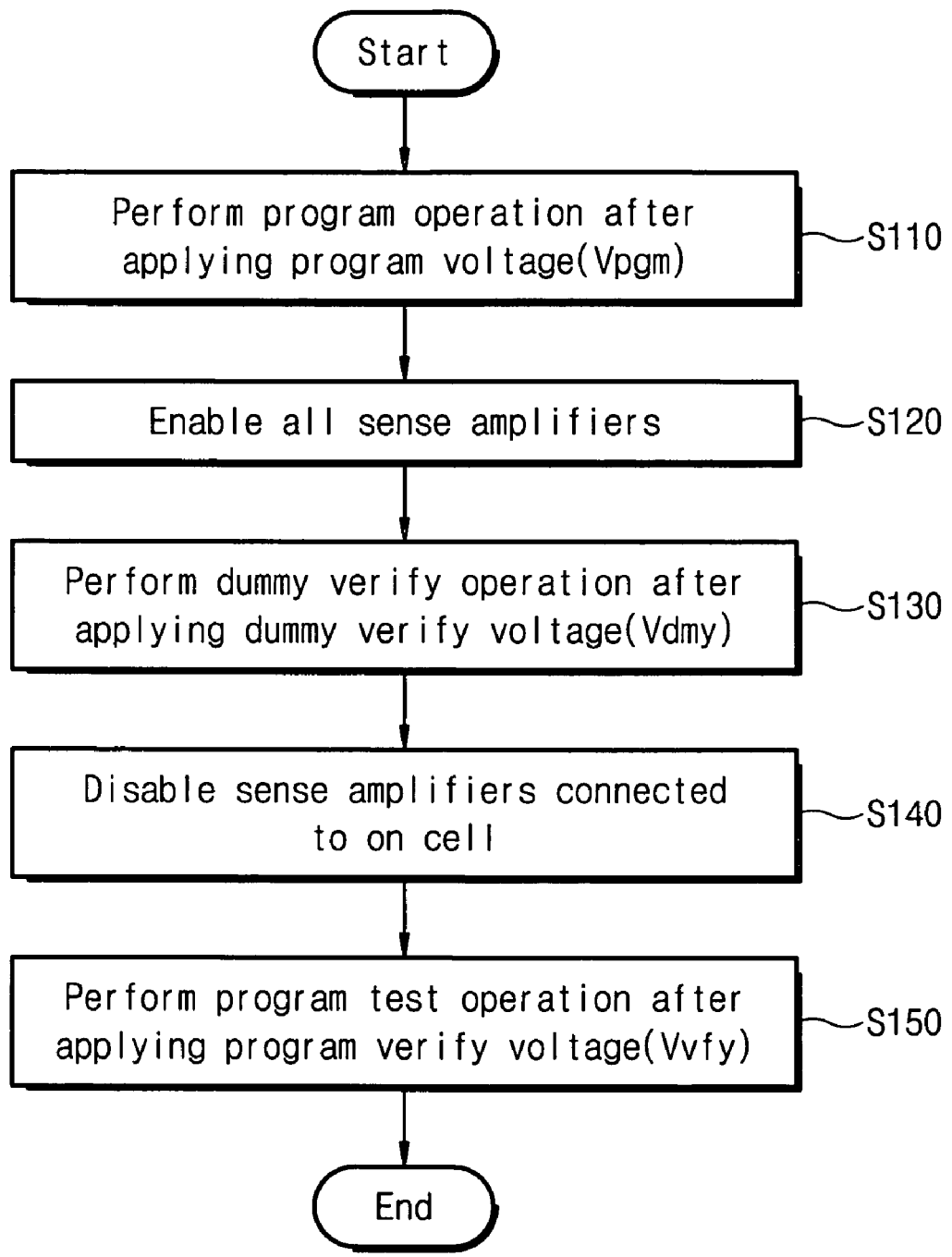

NOR FLASH MEMORY DEVICES IN WHICH A PROGRAM VERIFY OPERATION IS PERFORMED ON SELECTED MEMORY CELLS AND PROGRAM VERIFY METHODS ASSOCIATED THEREWITH

RELATED APPLICATION

This application claims the benefit of and priority to Korean Patent Application No. 2005-0073444, filed Aug. 10, 2005, in the Korean Intellectual Property Office, the disclosure of which is hereby incorporated herein by reference as if set forth in its entirety.

FIELD OF THE INVENTION

The present invention relates to semiconductor memory devices, and, more particularly, to NOR flash memory devices and program verify methods associated therewith.

BACKGROUND OF THE INVENTION

Generally, a semiconductor memory device is a storage device that stores data and, if necessary, the stored data can be read. Semiconductor memory device may be classified into random access memory (RAM) and read only memory (ROM). A RAM is a volatile memory device in which stored data is lost when power is turned off. A ROM is nonvolatile memory device in which stored data is retained even if power is turned off. RAM memories include dynamic RAM (DRAM), static RAM (SRAM), etc. ROM memories include programmable ROM (PROM), erasable PROM (EPROM), electrically EPROM (EEPROM), flash memory, etc. Flash memory devices may be classified into NAND flash memory devices and NOR flash memory devices. A NOR flash memory device is a code-storing type memory and is widely used in mobile terminal applications that desire fast data operations because of high operation speeds.

A memory cell of a NOR flash memory device is connected between a bit line and a source line. A plurality of memory cells connected to one word line share the source line. A memory cell is detected as an on cell or an off cell depending on a word line voltage during a read operation. An on cell means that the memory cell is in a turned-on state because the word line voltage is greater than the threshold voltage. In this state, a current greater than a predetermined current flows in the memory cell. An off cell means that the memory cell is in a turned-off state because the word line voltage is less than the threshold voltage. In this state, a current less than a predetermined current flows in the memory cell.

A NOR flash memory device typically performs a program verify operation after a program operation. The program verify operation is to verify whether the threshold voltage of the memory cell has reached a desired level. The program verify operation applies a program verify voltage to the word line and determines whether the program operation is "pass" or "fail" by sensing a current that flows in the memory cell.

The program verify operation is performed on the plurality of memory cells (e.g. 128 memory cells) at the same time. The plurality of memory cells may include memory cells requiring program verification and memory cells requiring no program verification. The memory cells that do not require program verification are those memory cells having a threshold voltage less than the desired program state or those memory cells that have already "passed" program verification.

During the program verify operation, a relatively large amount of current flows in the memory cells including those requiring no program verification. Because the voltage level of the source line increases, the program is passed before the threshold voltage of the memory cells requiring the program verification reaches the desired level.

For example, a memory cell may include four states such as "11," "10," "01," and "00" according to the threshold voltage. During a "01" program operation, a memory cell in a "11" state and a memory cell in a "01" state may coexist. During the "01" program verify operation, a large amount of a current may flow in the memory cell in the 11 state causing the voltage level in the source line to increase. This may affect the memory cell in the "01" state. That is, the program may be passed before the threshold voltage of the memory cell reaches the "01" state.

SUMMARY

According to some embodiments of the present invention, a program operation for a NOR flash memory device is verified by programming data in a memory cell, performing a dummy verify operation on the memory cell, and performing a program verify operation on the memory cell based on a result of the dummy verify operation.

In other embodiments, the method further comprises enabling a sense amplifier that is connected to the memory cell before performing the dummy verify operation.

In still other embodiments, the method further comprises disabling the sense amplifier connected to the memory cell of the result of the dummy verify operation indicates that the memory cell is on.

In still other embodiments, performing the program verify operation comprises performing the program verify operation on the memory cell if the result of the dummy verify operation indicates that the memory cell is off.

In still other embodiments, performing the dummy verify operation comprises performing the dummy verify operation using a dummy verify voltage and performing the program verify operation comprises performing the program verify operation using a program verify voltage such that a magnitude of the dummy verify voltage is less than a magnitude the program verify voltage.

In still other embodiments, the data programmed in the memory cell is multi-bit data.

In further embodiments of the present invention, a NOR flash memory device is programmed by programming data in a plurality of memory cells that share a source line, enabling sense amplifiers respectively connected to the plurality of memory cells, applying a dummy verify voltage to the plurality of memory cells, performing a dummy verify operation on the plurality of memory cells responsive to application of the dummy verify voltage, determining if any of the memory cells is on based on a result of the dummy verify operation, for each of the memory cells that is determined to be on, disabling the sense amplifier that is connected thereto, applying a program verify voltage to the plurality of memory cells, and performing a program verify operation on the plurality of memory cells responsive to application of the program verify voltage.

In still further embodiments, disabling the sense amplifier comprises disabling the sense amplifier such that the sense amplifier does not supply a current to the memory cell that is connected thereto.

In still further embodiments, a magnitude of the dummy verify voltage is less than a magnitude the program verify voltage.

In still further embodiments, the method further comprises for each of the memory cells that is determined to be off, enabling the sense amplifier that is connected thereto.

In still further embodiments, enabling the sense amplifier comprises enabling the sense amplifier such that the sense amplifier supplies a current to the memory cell that is connected thereto.

In still further embodiments, the data programmed in the plurality of memory cells comprises 2-bit data, and performing the program verify operation comprises performing a "10" program verify operation, a "01" program verify operation, and a "00" program verify operation.

In other embodiments of the present invention, a NOR flash memory device comprises a plurality of memory cells that share a source line, a plurality of sense amplifiers respectively connected to the plurality of memory cells, and a voltage generating circuit that is configured to supply a word line voltage to the plurality of memory cells and a dummy verify voltage to the plurality of memory cells before a program verify operation. The plurality of sense amplifiers are configured to selectively supply a current to the plurality of memory cells during the program verify operation based on a result of a dummy verify operation that uses the dummy verify voltage.

In still other embodiments, the voltage generating circuit is further configured to supply a program verify voltage having a magnitude that is greater than a magnitude of the dummy verify voltage during the program verify operation.

In still other embodiments, each of the sense amplifiers comprises an amplifier circuit that is configured to supply the current to the memory cell connected thereto and to sense and amplify the a current that slows in the memory cell connected thereto and a latch circuit that is configured to latch an output signal of the amplifier circuit during the dummy verify operation and to control the current supplied from the amplifier circuit to the memory cell connected thereto during the program verify operation based on the latched output signal.

In still other embodiments, the latch circuit comprises a latch connected between a first node that is responsive to an output signal of the amplifier circuit and a second node that is configured to output the latched output signal, a reset circuit that is connected between the first node and a common reference node and is configured to reset the first node to a common reference voltage responsive to a reset signal, and a set circuit that is connected between a power terminal and the first node and is configured to set the first node to a power voltage based on the latched output signal.

In still other embodiments, the amplifier circuit is configured to supply the current to the memory cell connected thereto responsive to the first node being reset to the common reference voltage and to cut off the current to the memory cell connected thereto responsive to the first node being set to the power voltage.

In still other embodiments, the device further comprises a controller that is configured to generate the reset signal before the dummy verify operation.

In still other embodiments, the plurality of sense amplifiers is configured to cut off the current to any of the plurality of memory cells that are determined to be on based on a result of the dummy verify operation.

In still other embodiments, the plurality of sense amplifiers is configured to supply the current to any of the plurality of memory cells that are determined to be off based on the result of the dummy verify operation.

BRIEF DESCRIPTION OF THE DRAWINGS

Other features of the present invention will be more readily understood from the following detailed description of specific embodiments thereof when read in conjunction with the accompanying drawings, in which:

FIG. 6 is a flowchart that illustrates programming operations for a NOR flash memory device according to some embodiments of the present invention.

DETAILED DESCRIPTION OF EMBODIMENTS

Figure 1:
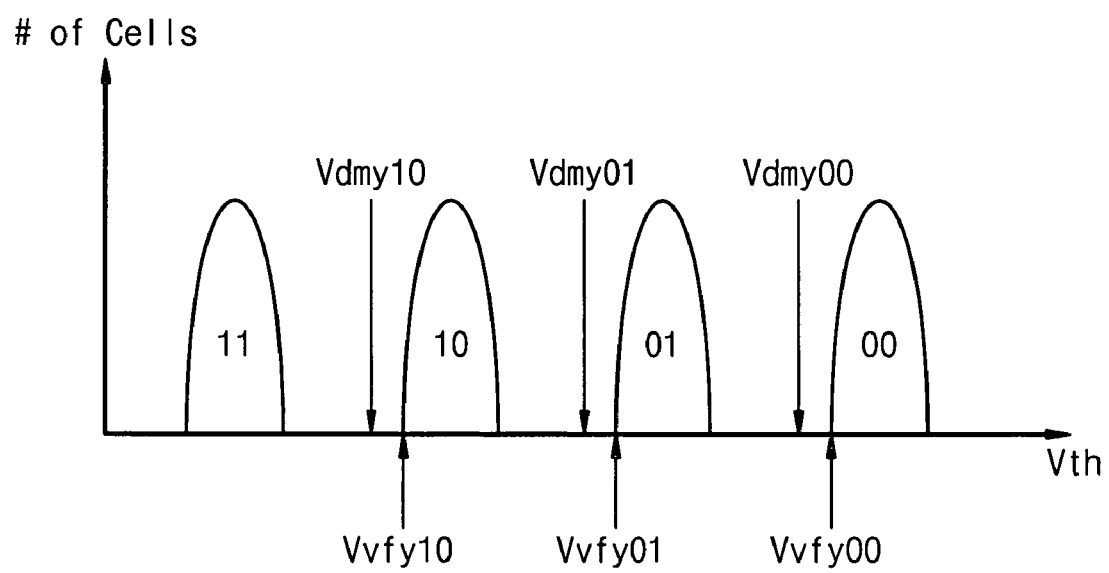
FIG. 1 is a graph illustrating a distribution of memory cells according to a threshold voltage Vth.

While the present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements. As used herein, the term "and/or" and "/" includes any and all combinations of one or more of the associated listed items. Like numbers refer to like elements throughout the description.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various components, circuits, regions, layers and/or sections, these components, circuits, regions, layers and/or sections should not be limited by these terms. These terms are only used to distinguish one component, circuit, region, layer or section from another component, circuit, region, layer or section. Thus, a first component, circuit, region, layer or section discussed below could be termed a second component, circuit, region, layer or section, and similarly, a second component, circuit, region, layer or section may be termed a first component, circuit, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a graph that illustrates a distribution of memory cells according to a threshold voltage Vth. A NOR flash memory device can store single-bit data or multi-bit data in a memory cell. FIG. 1 illustrates the multi-bit data states of memory cells according to threshold voltage.

A memory cell has one of "11," "10," "01," and "00" states according to the threshold voltage. The "11" state memory cell is an erased cell and has the lowest threshold voltage. The "10" state memory cell has a threshold voltage greater than the "11" state memory cell. The "01" state memory cell has a threshold voltage greater than the "10" state memory cell. Additionally, the "00" state memory cell has a threshold voltage greater than of the "01" state memory cell.

The program verify voltages Vvfy10, Vvfy01 and Vvfy00 and dummy verify voltages Vdmy10, Vdmy01 and Vdmy00 are illustrated in FIG. 1. The program verify voltage is used to verify whether a memory cell reaches a desired state after data is programmed in the memory cell. As illustrated in FIG. 1, the dummy verify voltage has a level that is less than the program verify voltage. The dummy verify voltage is supplied to a word line during the dummy verify operation, and the program verify voltage is supplied to the word line during the program verify operation.

In accordance with some embodiments of the present invention, a NOR flash memory device performs the dummy verify operation before the program verification operation. Based on a result of the dummy verify operation, the program verify operation is not performed when the memory cell is an on cell, and the program operation is performed when the memory cell is an off cell.

Figure 2:
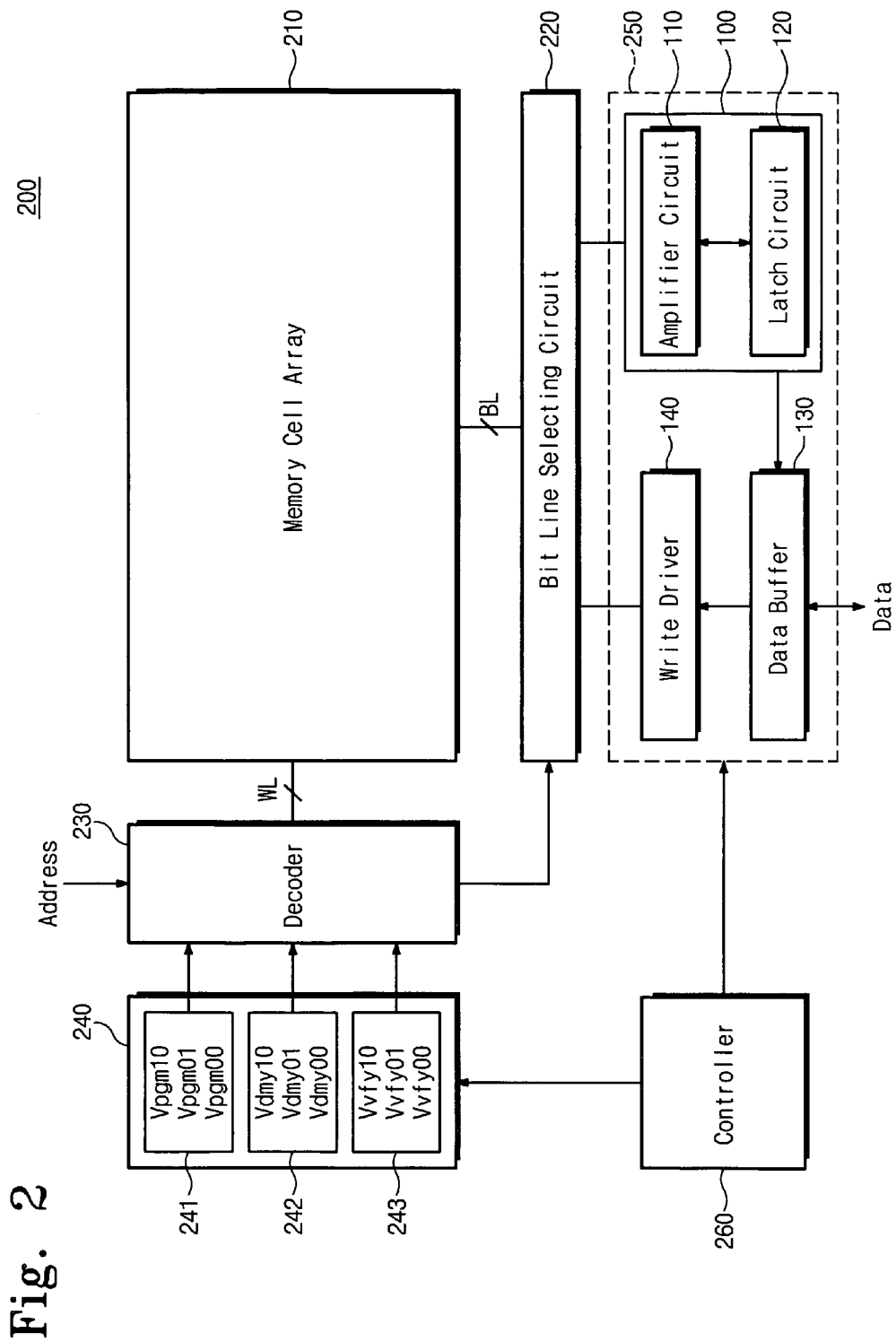
FIG. 2 is a block diagram of a NOR flash memory device according to some embodiments of the present invention.

FIG. 2 is a block diagram of a NOR flash memory device according to some embodiments of the present invention. The NOR flash memory device 200 includes a memory cell array 210, a bit line selecting circuit 220, a decoder 230, a voltage generating circuit 240, a data input/output circuit 250, and a controller 260. Because the memory cell array 210, the bit line selecting circuit 220, and the decoder 230 are well known to those skilled in the art, a detailed description thereof will be omitted.

The voltage generating circuit 240 includes a program voltage generating circuit 241, a dummy voltage generating circuit 242, and a verify voltage generating circuit 243. The controller 260 controls operations of the voltage generating circuit 240. That is, the program voltage generating circuit 241 is operated during the program operation, the dummy voltage generating circuit 242 is operated during the dummy verify operation, and the verify voltage generating circuit 243 is operated during the program verify operation.

The program voltage generating circuit 241 generates a voltage to perform the program operation. The program voltages Vpgm10, Vpgrn01 and Vpgrn00 are used to program the memory cells to a "10" state, a "01" state and a "00" state, respectively.

The dummy voltage generating circuit 242 generates a voltage to perform the dummy verify operation. The dummy verify voltages Vdmy10, Vdmy10 and Vdmy00 are used to verify a state of the memory cell before the program verification. Based on a result of the dummy verify operation, a sense amplifier connected to the memory cell is disabled when the memory cell is sensed as an on cell. However, the sense amplifier is enabled when the memory cell is sensed as an off cell. This will be described in more detail with reference to FIGS. 3 and 4.

The verify voltage generating circuit 243 generates a voltage to perform the program verify operation. The program verify voltages Vvfy10, Vvfy01 and Vvfy00 are used to verify whether each of the memory cells is in a "10" state, a "01" state, or a "00" state. For example, when a memory cell programmed to a "01" state has a threshold voltage less than a "01" verify voltage Vvfy01, a result of a "01" program verify operation is "fail." In this case, the "01" program operation is performed again. Conversely, when a memory cell programmed to a "01" state has a threshold voltage greater than a "01" verify voltage Vvfy01, a result of the "01" program verify operation is "pass. In this case, the "01" program operation is terminated.

A data input/output circuit 250 includes a sense amplifier 100, a data buffer 130, and a write driver 140. During a program operation, data input on the data butter 130 is programmed on a selected memory cell through the write driver 140. During the dummy verify operation and the program verify operation, the data programmed on the memory cell is output through the sense amplifier 100 and the data buffer 130. The controller 260 controls operations of the data input/output circuit 250.

The sense amplifier 100 includes an amplifier circuit 110 and a latch circuit 120. The amplifier circuit 110 supplies a current to a selected memory cell, and also senses and amplifies the current flowing in the memory cell. The latch circuit 120 latches an output signal of the amplifier circuit 110, and controls a current supply from the amplifier circuit 110 to the memory cell according to the latched output signal. The sense amplifier 100 supplies or cuts off current to the memory cell based on a result of the dummy verify operation during the program verify operation. The internal configuration and principles of operation of the sense amplifier 100 will now be described in more detail.

The NOR flash memory device 200 performs the dummy verify operation before the program verification operation. During the dummy verify operation, the dummy verify voltage (for example, Vdmy01) is supplied to the selected word line. The sense amplifier 100 senses a current flowing in the memory cell during the dummy verify operation and determines whether the memory cell is an on cell or an off cell. The sense amplifier 100 cuts off the current supply to the memory cell during the program verify operation when the memory cell is an on cell. When the memory cell is an off cell, the sense amplifier 100 supplies current to the memory cell during the program verify operation.

Figure 3:
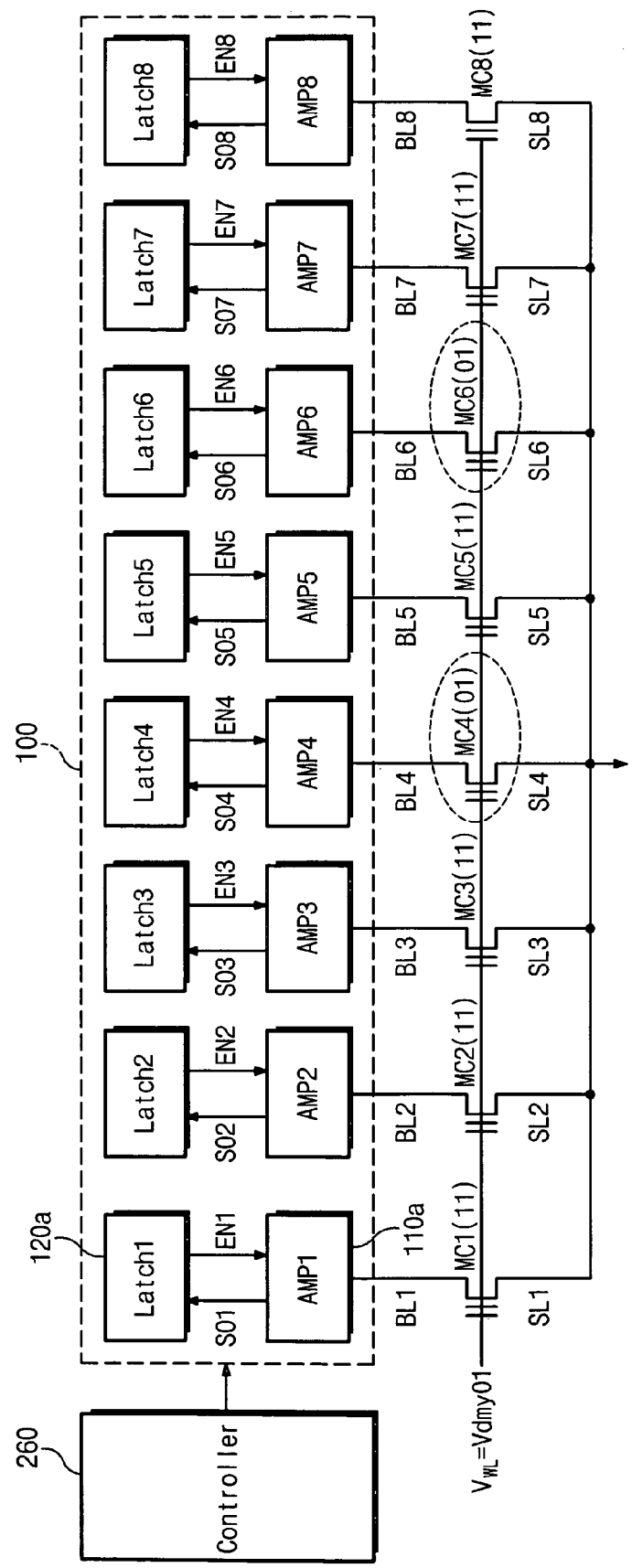
FIG. 3 is a block diagram that illustrates a NOR flash memory device that performs a dummy verify operation before a program verification in accordance with some embodiments of the present invention.

FIG. 3 is a block diagram that illustrates a NOR flash memory device that performs a dummy verify operation before a program verification in accordance with some embodiments of the present invention. FIG. 3 illustrates a "01" dummy verify operation by way of example. Referring to FIG. 3, a NOR flash memory device includes eight memory cells MC1 to MC8, a sense amplifier 100, and a controller 260. The controller 260 controls operation of the sense amplifier 100.

Source lines SL1 to SL8 of the memory cells MC1 to MC8 are connected to each other. That is, a 01 dummy verify voltage Vdmy01 is applied to word lines of the memory cells MC1 to MC8. The sense amplifier 100 is connected to bit lines BL1 to BL8 of the memory cells MC1 to MC8. The amplifier 100 includes amplifier circuits AMP1 to AMP8, and latch circuits Latch1 to Latch8.

As illustrated in FIG. 3, the memory cells MC4 and MC6 are in a "01" program state, and the memory cells MC1 to MC3, MC5, MC7 and MC8 (hereinafter, referred to as MC1*) are in an erase state (i.e., "11" state). When the "01" dummy verify voltage Vdmy01 is applied to the word lines of the memory cells MC1 to MC8, the memory cells MC4 and MC6 are turned off and the memory cells MC1* are turned on because the "01" dummy verify voltage Vdmy01 is greater than the threshold voltage of the memory cells MC1*, and less than the threshold voltage of the memory cells MC4 and MC6.

The amplifier circuits AMP4 and AMP6 connected to the turned-off memory cells MC4 and MC6 generate output signals S04 and S06 at a low level. On the other hand, amplifier circuits AMP1 to AMP3, AMP5, AMP7, and AMP8 (hereinafter, referred to as AMP1*) connected to the turned-on memory cells MC1* generate output signals S01 to S03, S05, S07, and S08 (hereinafter, refereed to be as S01*) at a high level.

The latch circuits Latch4 and Latch6 latches the output signal S04 and S06 at a low level and provides enable signals EN4 and EN6 to the amplifier circuits AMP4 and AMP6. The amplifier circuits AMP4 and AMP6 are enabled in response to the enable signal EN4 and EN6 at a high level. On the other hand, the latch circuits Latch1 to Latch3, Latch5, Latch7 and Latch8 (hereinafter, referred to be as Latch1*) latch the output signal S01* at a high level, and provide enable signals EN1 to EN3, EN5, EN7 and EN8 (hereinafter, referred to be as EN1*) at a low level to the amplifier circuits AMP1*. The amplifier circuits AMP1* are disabled in response to the enable signal EN1* at a low level.

The amplifier circuits AMP 1 through AMP8 in FIG. 3 have similar configurations and operational principles. Additionally, the latch circuits Latch1 through Latch8 have similar configurations and operational principles. The internal configuration and principles of operation of the amplifier circuit and the latch circuit will now be described in more detail with reference to FIGS. 4 through 6.

According to some embodiments of the present invention, a NOR flash memory device prevent or reduce the likelihood that a voltage of a source line may increase during a program verify operation. When the voltage of the source line increases during a program verify operation, a result of the program verification can be erroneous. For example, a memory cell that was not successfully programmed to a "01" state can be determined as a program pass for the "01" state. According to some embodiments of the present invention, a NOR flash memory device performs a dummy verify operation before the program verification. Based on a result of the dummy verify operation, when the memory cell is sensed as an on cell, a current supply is cut off to the memory cell during the program verify operation. That is, in the above example, the current supply is cut off to the memory cell MC1* during the program verify operation. According to some embodiments of the present invention, a program verification can be performed more accurately because a source line voltage does not increase during the program verify operation.

Figure 4:
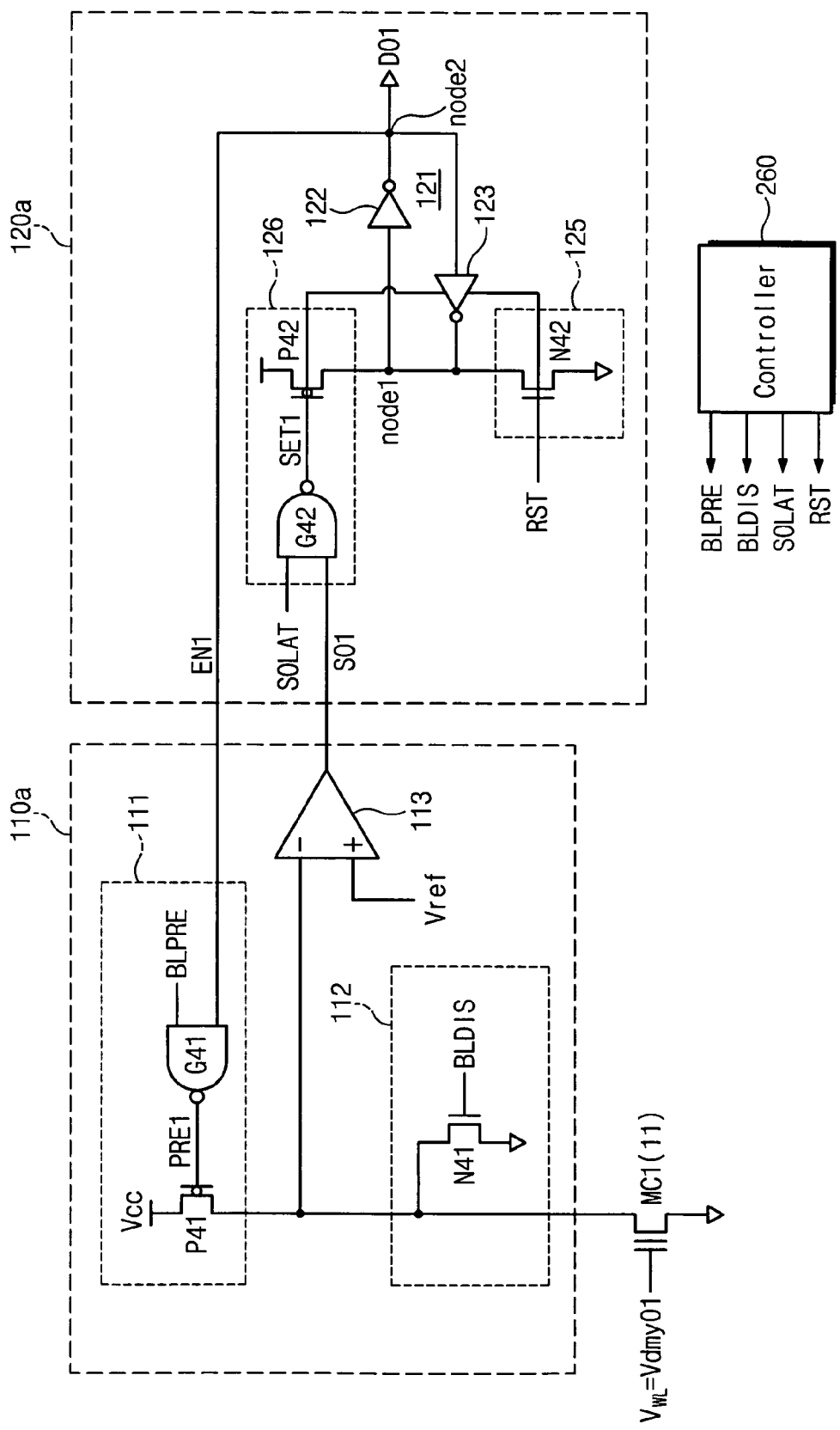
FIG. 4 is a schematic that illustrates a sense amplifier illustrated of FIG. 3 in accordance with some embodiments of the present invention.

FIG. 4 is a schematic that illustrates a sense amplifier illustrated of FIG. 3 in accordance with some embodiments of the present invention. FIG. 4 illustrates amplifier circuits AMP1 and 110a and latch circuits Latch1 and 120a. Referring to FIG. 4, the memory cell MC1 is in a 11 state. The memory cell MC1 is connected between a bit line BL1 and a source line SL1, and receives a "01" dummy verify voltage Vdmy01 through a word line. The controller 260 provides a bit line precharge signal BLPRE and a bit line discharge signal BLDIS to the amplifier circuit 110a, and also provides a latch signal SOLAT and a reset signal RST to a latch circuit 120a.

Referring to FIG. 4, the amplifier circuit 110a includes a precharge circuit 111, a discharge circuit 112, and an amplifier 113. The precharge circuit 111 is connected to a power terminal, and supplies a power voltage Vcc to a bit line BL1 in response to the enable signal EN1 supplied from the latch circuit 120a and the bit line precharge signal BLPRE supplied from the controller 260. The precharge circuit 111 includes a PMOS transistor P41 and a NAND gate G41. The NAND gate G41 receives the bit line precharge signal BLPRE and an enable signal EN1, and supplies the precharge signal PREL to a gate of the PMOS transistor P41.

The discharge circuit 112 is connected to a bit line BL1 and a ground or common reference potential. The discharge circuit discharges the first bit line BL1 in response to the bit line discharge signal BLDIS supplied from the controller 260. The discharge circuit 112 includes an NMOS transistor N41. The amplifier 113 senses a state of the memory cell MC1 by comparing a cell current with a reference current. The reference voltage Vref of FIG. 4 is supplied from a reference voltage generator (not shown). The amplifier 113 receives the reference voltage and generates a reference current.

Referring to FIG. 4, a latch circuit 120a includes a latch 121, a reset circuit 125, and a set circuit 126. The latch 121 includes two inverters 122 and 123 connected between a first node node1 and a second node node2. An enable signal EN1 is generated from the second node node2 and is supplied to the precharge circuit 111. The inverter 123 is responsive to a reset signal RST supplied from a reset circuit 125 and a set signal SET supplied from a set circuit 126. A configuration and an operation of the inverter 123 will be described with reference to FIG. 5.

The reset circuit 125 is connected between the first node node1 and a ground or common reference potential. The reset circuit 125 resets the first node node1 in response to the reset signal RST supplied from the controller 260. The reset circuit 125 includes an NMOS transistor N42. The set circuit 126 is connected between a power terminal and the first node node1. The set circuit 126 supplies a power voltage Vcc to the first node node1 in response to a latch signal SOLAT supplied from the controller 260 and an output signal S01 of an amplifier circuit. The set circuit 126 includes a NAND gate G42 and a PMOS transistor P42. The NAND gate G42 generates a set signal SET1 by performing a logic operation on the latch signal SOLAT and the output signal S01. The set signal SET1 is supplied to a gate of the PMOS transistor P42.

Figure 5:
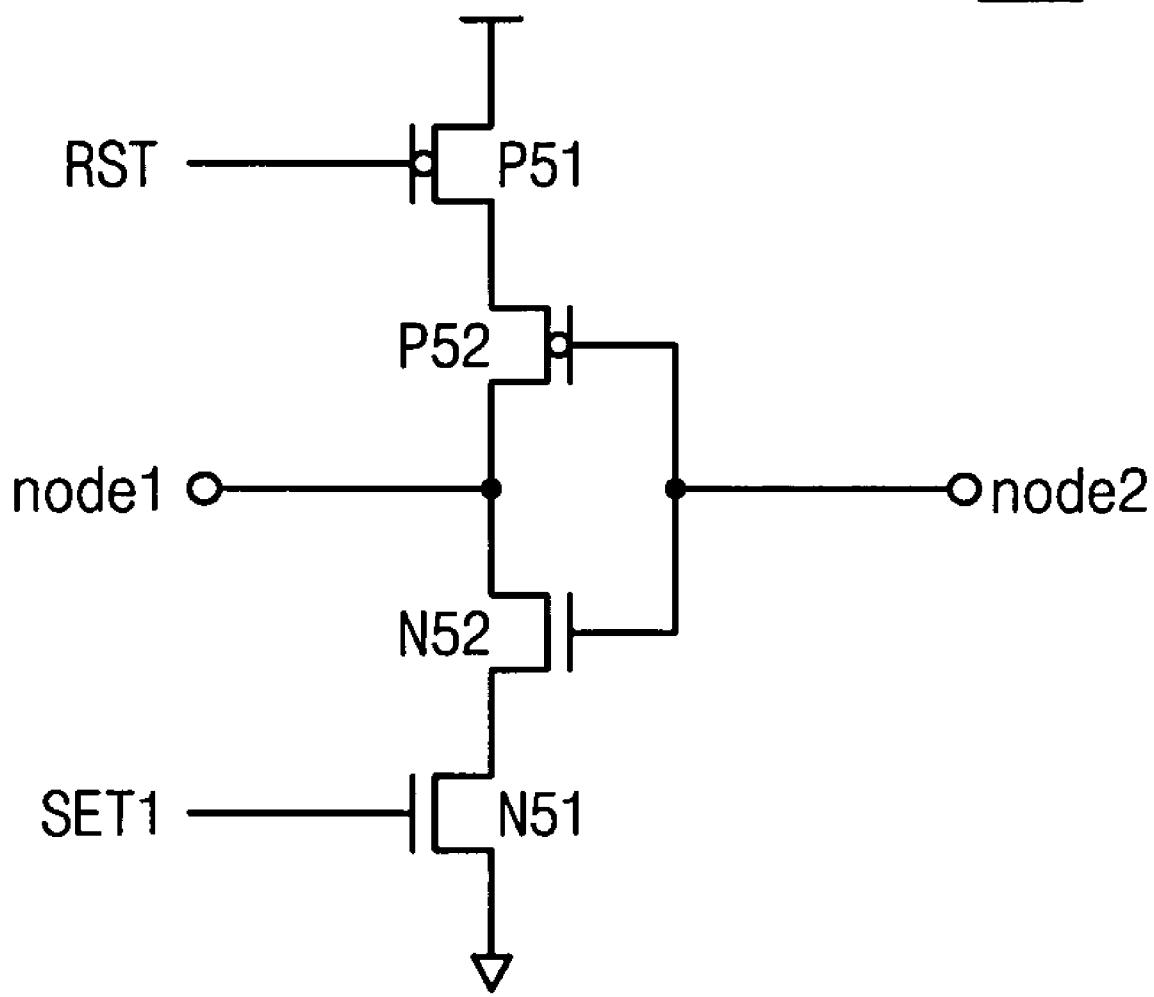
FIG. 5 is a schematic of an inverter of a latch illustrated in FIG. 4 in accordance with some embodiments of the present invention.

FIG. 5 is a schematic of an inverter of a latch illustrated in FIG. 4 in accordance with some embodiments of the present invention. Referring to FIG. 5, the inverter 123 includes two NMOS transistors N51 and N52 and two PMOS transistors P51 and P52. The NMOS transistor N52 is responsive to the set signal SET1 and the PMOS transistor P51 is responsive to the reset signal RST. When the set signal SET1 is at a low level, the NMOS transistor N51 is turned off. By doing this, when the PMOS transistor P42 is turned on in FIG. 4, a voltage level at the first node node1 may not be at a high level. Exemplary operations of the amplifier circuit 110a and the latch circuit 120a shown in FIGS. 4 and 5 will be described with reference to FIG. 6.

FIG. 6 is a flowchart that illustrates programming operations for a NOR flash memory device according to some embodiments of the present invention. At block S110, a program voltage Vpgm is applied to the memory cell(s) and a program operation is performed. For example, when the "01" program voltage Vpgm01 is applied to the word line and then the program operation is performed as illustrated in FIG. 3, the memory cells MC4 and MC6 are programmed to be in a 01 state. Thus, the memory cells MC1* maintain a "11" state.

At block S120, all sense amplifiers connected to a plurality of memory cells are enabled. Referring to FIG. 4, the latch circuit 120a receives the reset signal RST from the controller 260. When the reset signal RST is input, the first node, node1, of latch 121 is driven to a low level, and the second node, node2, is driven to a high level. If the enable signal EN1 is at a high level when the bit line precharge signal BLPRE is at a high level, then the precharge signal PRE1 is at a low level. When the precharge signal PRE1 is at a low level, the PMOS transistor P41 is turned on and the power voltage Vcc is supplied to the bit line BL1. The sense amplifiers connected to a plurality of memory cells are enabled in response to the reset signal RST supplied from the controller 260.

At block S130, the dummy verify voltage Vdmy is applied to the memory cell and the dummy verify operation is performed. Referring to FIG. 3, because a "01" dummy verify voltage Vdmy01 is greater than the threshold voltage of the memory cells MC1*, the memory cells MC1* are turned on. When the memory cells MC1* are turned on, the voltage level of the bit lines BL1* decreases. Conversely, because the 01 dummy verify voltage Vdmy01 is less than that of the memory cells MC4 and MC6, the memory cells MC4 and MC6 are turned off. When the memory cells MC4 and MC6 are turned off, the voltage level of the bit lines BL4 and BL6 are maintained a precharge state.

At block S140, the sense amplifier connected to the on cell is enabled as a result of the dummy verify operation. Referring to FIG. 4, when the "01" dummy verify voltage Vdmy01 is applied to the memory cell MC1, the voltage level of the bit line BL1 becomes low. When the voltage level of the bit line BL1 becomes low, an output signal S01 of an amplifier circuit 110a is driven to a high level. When the output signal S01 is at a high level when the latch signal SOLAT is at a high level, the set signal SET1 is driven to a low level. When the set signal SET1 is at a low level, the PMOS transistor P42 is turned on and the power voltage Vcc is supplied to the first node, node1. At this point, the second node, node2, is at a low level. When the second node, node2, is at a low level, a precharge signal PRE1 is at a high level because an enable signal is at a low level. When the precharge signal PRE1 is at a high level, the PMOS transistor P41 is turned off and the power voltage Vcc is not supplied to the bit line BL1. As a result, the sense amplifiers connected to the memory cells MC1* are disabled.

Conversely, when the "01" dummy verify voltage Vdmy01 is applied to the memory cells MC4 and MC6, an output signal S01 of an amplifier circuit 110a is driven to a low level. At this point, the enable signals EN4 and EN6 maintain a high level state. When the enable signals EN4 and EN6 are at a high level, the power voltage Vcc is supplied to the bit lines BL4 and BL6 because precharge signals PRE4 and PRE6 are at a low level. As a result, the sense amplifiers connected to the memory cells MC4 and MC6 maintain an enable state.

At block S150, the program verify voltage Vvfy is applied to the memory cell and the program verify operation is performed. Referring to FIG. 3, the 01 program verify voltage Vvfy01 is applied to a plurality of memory cells sharing the same source line. When the "01" program verify voltage Vvfy01 is applied to the memory cells MC1 through MC8, the amplifier circuits AMP1* are in a disabled state and the amplifier circuits AMP4 and AMP6 are in an enable state. Accordingly, a current does not flow through the memory cells MC1* during the 01 program verify operation. Because the current does not flow in the memory cells MC1*, the voltage on the source lines SL1* does not increase.

As described above, a NOR flash memory device may be programmed by performing a dummy verify operation before the program verification in accordance with some embodiments of the present invention. Based on a result of the dummy verify operation, the sense amplifier is disabled when the memory cell is determined to be an on cell. The program verify operation is performed through sense amplifiers connected to off cells. Accordingly, the present invention may reduce the likelihood of erroneous results when performing program verification, which may be caused by an increase in source line voltage during the program verify operation.

As described above, in a NOR flash memory device and a program method thereof in accordance with some embodiments of the present invention, an increase in source line voltage can be avoided or the magnitude thereof can be reduced during a program verify operation. Accordingly, program verification accuracy may be improved.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A method of verifying a program operation of a NOR flash memory device, comprising:
    programming data in a memory cell;
    performing a dummy verify operation on the memory cell;
    controlling a sense amplifier connected to the memory cell to be disabled based on a result of the dummy verify operation; and
    performing a program verify operation on the memory cell based on a result of the dummy verify operation;
    wherein the program verify operation is performed only when the sense amplifier connected to the memory cell is enabled.

2. The method of claim 1, further comprising:
    enabling the sense amplifier that is connected to the memory cell before performing the dummy verify operation.

3. The method of claim 2,
    wherein the controlling comprises disabling the sense amplifier connected to the memory cell if the result of the dummy verify operation indicates that the memory cell is on.

4. The method of claim 1, wherein performing the program verify operation comprises:
    performing the program verify operation on the memory cell if the result of the dummy verify operation indicates that the memory cell is off.

5. The method of claim 1, wherein performing the dummy verify operation comprises performing the dummy verify operation using a dummy verify voltage and performing the program verify operation comprises performing the program verify operation using a program verify voltage, and wherein a magnitude of the dummy verify voltage is less than a magnitude the program verify voltage.

6. The method of claim 1, wherein the data programmed in the memory cell is multi-bit data.

7. A method of verifying a program operation of a NOR flash memory device, comprising:

programming data in a plurality of memory cells that share a source line;

enabling sense amplifiers respectively connected to the plurality of memory cells;

applying a dummy verify voltage to the plurality of memory cells;

performing a dummy verify operation on the plurality of memory cells responsive to application of the dummy verify voltage;

determining if any of the memory cells is on based on a result of the dummy verify operation;

for each of the memory cells that is determined to be on, disabling the sense amplifier that is connected thereto;

applying a program verify voltage to the plurality of memory cells; and performing a program verify operation on the plurality of memory cells responsive to application of the program verify voltage.

8. The method of claim 7, wherein disabling the sense amplifier comprises disabling the sense amplifier such that the sense amplifier does not supply a current to the memory cell that is connected thereto.

9. The method of claim 7, wherein a magnitude of the dummy verify voltage is less than a magnitude the program verify voltage.

10. The method of claim 7, further comprising:
enabling the sense amplifier that is connected thereto for each of the memory cells that is determined to be off.

11. The method of claim 10, wherein enabling the sense amplifier comprises enabling the sense amplifier such that the sense amplifier supplies a current to the memory cell that is connected thereto.

12. The method of claim 7, wherein the data programmed in the plurality of memory cells comprises 2-bit data, and performing the program verify operation comprises performing a "10" program verify operation, a "01" program verify operation, and a "00" program verify operation.

13. A NOR flash memory device, comprising:
a plurality of memory cells that share a source line;
a plurality of sense amplifiers respectively connected to the plurality of memory cells; and
a voltage generating circuit that is configured to supply a word line voltage to the plurality of memory cells and a dummy verify voltage to the plurality of memory cells before a program verify operation;
wherein the plurality of sense amplifiers are configured to selectively supply a current to the plurality of memory cells during the program verify operation based on a result of a dummy verify operation that uses the dummy verify voltage.

14. The device of claim 13, wherein the voltage generating circuit is further configured to supply a program verify voltage having a magnitude that is greater than a magnitude of the dummy verify voltage during the program verify operation.

15. The device of claim 13, wherein each of the sense amplifiers comprises:
an amplifier circuit that is configured to supply the current to the memory cell connected thereto and to sense and amplify the a current that slows in the memory cell connected thereto; and
a latch circuit that is configured to latch an output signal of the amplifier circuit during the dummy verify operation and to control the current supplied from the amplifier circuit to the memory cell connected thereto during the program verify operation based on the latched output signal.

16. The device of claim 15, wherein the latch circuit comprises:
a latch connected between a first node that is responsive to an output signal of the amplifier circuit and a second node that is configured to output the latched output signal;
a reset circuit that is connected between the first node and a common reference node and is configured to reset the first node to a common reference voltage responsive to a reset signal; and
a set circuit that is connected between a power terminal and the first node and is configured to set the first node to a power voltage based on the latched output signal.

17. The device of claim 16, wherein the amplifier circuit is configured to supply the current to the memory cell connected thereto responsive to the first node being reset to the common reference voltage and to cut off the current to the memory cell connected thereto responsive to the first node being set to the power voltage.

18. The device of claim 17, further comprising a controller that is configured to generate the reset signal before the dummy verify operation.

19. The device of claim 13, wherein the plurality of sense amplifiers is configured to cut off the current to any of the plurality of memory cells that are determined to be on based on a result of the dummy verify operation.

20. The device of claim 13, wherein the plurality of sense amplifiers is configured to supply the current to any of the plurality of memory cells that are determined to be off based on the result of the dummy verify operation.

* * * * *